(12) United States Patent
Okuyama

(10) Patent No.: US 6,304,943 B1
(45) Date of Patent: Oct. 16, 2001

(54) SEMICONDUCTOR STORAGE DEVICE WITH BLOCK WRITING FUNCTION AND REDUCE POWER CONSUMPTION THEREOF

(75) Inventor: Hiroaki Okuyama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/090,983

(22) Filed: Jun. 5, 1998

(30) Foreign Application Priority Data

Jun. 6, 1997 (JP) .................................................. 9-149557

(51) Int. Cl.[7] .................................................. G06F 12/00
(52) U.S. Cl. .............................. 711/118; 711/3; 711/143; 711/154
(58) Field of Search .............................. 711/3, 117, 118, 711/125, 143, 154, 167; 365/189.01, 189.08, 222, 230.01, 211, 212

(56) References Cited

U.S. PATENT DOCUMENTS

| 4,744,063 | * | 5/1988 | Ohtani et al. ........................ 365/233 |
| 5,208,774 | * | 5/1993 | Shibue ............................ 365/189.08 |
| 5,208,783 | * | 5/1993 | Ninomiya et al. .................... 365/233 |
| 5,265,047 |   | 11/1993 | Leung et al. . |
| 5,526,510 | * | 6/1996 | Akkary et al. ........................ 711/133 |
| 5,559,747 |   | 9/1996 | Kasamizugami et al. . |
| 5,668,968 | * | 9/1997 | Wu ........................................ 711/3 |

FOREIGN PATENT DOCUMENTS

| 0470574 | 12/1992 | (EP) . |
| 0498520 | 12/1992 | (EP) . |
| 63071746 | 1/1988 | (JP) . |

\* cited by examiner

Primary Examiner—Tuan V. Thai
(74) Attorney, Agent, or Firm—McDermott, Will & Emery

(57) ABSTRACT

In a system using a microprocessor including a cache memory, a specific memory cell row including at least one row of memory cells is provided to a cache memory cell array of the cache memory so as to be used as a write back buffer. When data is to be saved in the specific memory cell row (write back buffer), the memory cells aligned in one row in the cache memory cell array are selected by an arbitrary word line, and all the data to be saved are simultaneously written in the specific memory cell row (write back buffer) through bit line pairs in a batch. Therefore, since the data to be saved can be written in the specific memory cell row (write back buffer) without using a data bus, the number of accesses to be made to the cache memory can be decreased. As a result, the throughput can be improved and the power consumption of the microprocessor can be decreased. In addition, since the write back buffer is constituted by the specific memory cell row, the chip area can be decreased.

17 Claims, 8 Drawing Sheets

101 MEMORY CELL

201 SPECIFIC MEMORY CELL

201 SPECIFIC MEMORY CELL

SEMICONDUCTOR STORAGE DEVICE WITH BLOCK WRITING FUNCTION AND REDUCE POWER CONSUMPTION THEREOF

BACKGROUND OF THE INVENTION

The present invention relates to improvement of a semiconductor storage device such as a cache memory.

A recent microprocessor is generally provided with a high-speed cache memory disposed between a CPU and a low-speed main mass storage device in order to improve the entire performance.

A cache memory is described in detail in, for example, "Computer Architecture: A Quantitative Approach" written by John L. Hennessy and David A. Patterson, published by Morgan Knafmann Publishers, Inc. (1990).

A control system for a cache memory is basically classified into the following two systems respectively adopting different write methods: a write through (store in) system and a write back system. In the write through system, both the cache memory and the main storage device are written. In contrast, in the write back system, merely the cache memory is written, and when a block in the cache memory where data has been changed is to be rewritten, the data is written in the main storage device.

FIG. 8 illustrates such a conventional cache memory, and is a block diagram for showing an exemplified configuration of the cache memory and peripheral related equipment.

In FIG. 8, a reference numeral 1 denotes a microprocessor, whose composing elements relating to the invention alone are shown in FIG. 8. A reference numeral 3 denotes a CPU, a reference numeral 4 denotes an external main storage device, a reference numeral 5 denotes a bus controller, a reference numeral 6 denotes an address bus, a reference numeral 7 denotes a data bus, a reference numeral 8 denotes a cache memory and a reference numeral 9 denotes a write back buffer.

In the cache memory having the aforementioned configuration, a write operation in the cache memory 8 by the write back system will now be described.

The address bus 6 transfers an address signal supplied by the CPU 3 to the cache memory 8 and also to the main storage device 4 through the bus controller 5. The data bus 7 transfers data between the cache memory 8 or the main storage device 4 and the CPU 3. The bus controller 5 controls the address bus 6 and the data bus 7 between the bus controller 5 and the main storage device 4. Also, a minimum unit of data transferred between the cache memory 8 and the main storage device 4 is designated as a block or a line, and the size of a block is generally larger than, for example, an integral number of times as large as a data width (bit number) of data transferred between the cache memory 8 and the data bus 7 in a batch.

When an arbitrary address in the cache memory 8 is to be written, when data of a block (or a line; hereinafter represented by the "block") including the address to be written is not changed (rewritten) while the data is being held in the cache memory 8, the same data remains in the main storage device 4, and hence, there is no need to write back the data in the main storage device 4. On the other hand, when the data of the block including the address to be written is changed while the data is being held in the cache memory 8, the data in the block is different from data in the main storage device 4, and hence, it is necessary to write back the data of the block in the main storage device 4 before writing new data in the cache memory 8.

While the data is being written back in the main storage device 4, a data write operation in the cache memory 8 is necessary to be waited. Since a data write operation in the main storage device 4 is conducted at a very low speed, the write back buffer 9 is used for temporarily holding the data to be written back in the main storage device 4 so that waiting time can be shortened.

In other words, when data of a block including an address to be written in a write operation in the cache memory 8 is necessary to be written back in the main storage device 4, the data of the block is first read from the cache memory 8 and is saved in the write back buffer 9 through the data bus 7. Then, the write operation in the cache memory 8 is conducted, and the data saved in the write back buffer 9 is written back in the low-speed main storage device 4 by utilizing spare time.

In the conventional configuration, however, the write back buffer 9 is provided as an external circuit of the cache memory 8, and hence, the write (save) operation in the write back buffer 9 should be conducted through the data bus 7. Data to be saved in the write back buffer 9 corresponds to all data of a minimum unit transferred between the cache memory 8 and the main storage device 4, namely, all data of the block including the address to be written, and the block size is several times as large as the data width of data transferred between the cache memory 8 and the data bus 7 in a batch. Therefore, in order to save the data of one block in the write back buffer 9, it is necessary to make several accesses to the cache memory 8 to read the data. For example, in the case where the data width of data transferred between the cache memory 8 and the data bus 7 in a batch is 32 bits and the block size is 128 bits (16 bytes), at least four accesses should be made to the cache memory 8 in order to save the data of one block in the write back buffer 9. Accordingly, the throughput of the entire system using the microprocessor 1 can be disadvantageously degraded.

Furthermore, since the number of accesses made to the cache memory 8 is increased, the power consumed by the microprocessor 1 can be disadvantageously increased.

In addition, the write back buffer 9 is required to hold data of a block with a large size. Therefore, even when the write back buffer 9 is constructed by using, for example, a generally used flip-flop and the like, the write back buffer 9 occupies a large area, resulting in increasing the chip area.

SUMMARY OF THE INVENTION

The objects of the invention are, in temporarily storing data necessary to be written back in a main storage device, improving throughput and decreasing consumed power by temporarily storing all the data to be written back through a smaller number of accesses, preferably through one access, to a cache memory, as well as decreasing the chip area by constructing a write back buffer or the like by using memory cells.

In order to achieve the aforementioned objects, the memory cell array of the cache memory of this invention is provided with a specific memory cell row for constituting a write back buffer, so that the data to be written back in the main storage device can be written and temporarily held in the specific memory cell row without using a data bus.

Specifically, the semiconductor storage device of this invention comprises a memory cell array including memory cells aligned in an array, each of the memory cells connected with each interconnection point between plural word lines extending in a row direction and plural bit line pairs extending in a column direction, and in this semiconductor storage device, one word line is selected among the plural word lines for selecting memory cells aligned in one row connected with the selected word line, and data are read from and written in the selected memory cells through bit line pairs connected with the selected memory cells, the memory cell array is provided with a specific memory cell row including at least one row of memory cells extending in the row direction, and the semiconductor storage device is further provided with writing means capable of writing all data of the memory cells aligned in one row and selected by the selected word line in the specific memory cell row through the bit line pairs connected with the selected memory cells.

In one aspect of the semiconductor storage device, the data of the memory cells aligned in one row and selected by the selected word line are read through the bit line pairs connected with the selected memory cells regardless of an operation of the writing means, and the writing means selects the specific memory cell row in reading the data of the selected memory cell aligned in one row, and writes all the data of the selected memory cells aligned in one row in the one row of memory cells included in the specific memory cell row through the bit line pairs connected with the selected memory cells.

In another aspect of the semiconductor storage device, the memory cells aligned in one row and included in the specific memory cell row are selected by a word line for selecting the specific memory cell row, and data of the selected memory cells included in the specific memory cell row are read through bit line pairs connected with the selected memory cells.

Furthermore, the semiconductor storage device can further comprise a column switch for selecting part of plural data read in the plural bit line pairs, and the part of data selected by the column switch is externally output to a data bus of a microprocessor.

In still another aspect of the semiconductor storage device, each of the memory cells included in the specific memory cell row is constructed by using a static memory cell including a cross connection circuit having a pair of inverting devices each constructed by a serial circuit having an input terminal and an output terminal and including serially connected load device and driving MOSFET, the pair of inverting devices being cross connected with the input terminals and the output terminals of the serial circuits; at least one pair of transferring MOSFETs each disposed between each of the output terminals of the pair of inverting devices and a bit line pair; and a controlling MOSFET disposed between a shared source shared by the driving MOSFETs of the pair of inverting devices and a reference potential line and controlled to be set in an unselected state in a data write operation.

Alternatively, each of the memory cells included in the specific memory cell row is constructed by using a static memory cell including a cross connection circuit having a pair of inverting devices each constructed by a serial circuit having an input terminal and an output terminal and including serially connected load device and driving MOSFET, the pair of inverting devices being cross connected with the input terminals and the output terminals of the serial circuits; at least one pair of transferring MOSFETs each disposed between each of the output terminals of the pair of inverting devices and a bit line pair; and a pair of controlling MOSFETs disposed respectively between one of the driving MOSFETs of the pair of inverting devices and a reference potential line and between the other of the driving MOSFETs and the reference potential line and controlled to be set in an unselected state in a data write operation.

Moreover, the cache memory of this invention comprises a cache memory cell array including memory cells aligned in an array, each of the memory cells connected with each intersection point between plural word lines extending in a row direction and plural bit line pairs extending in a column direction, and in this cache memory, one of the plural word lines is selected for selecting memory cells aligned in one row connected with the selected word line, and data are read from and written in the selected memory cells through bit line pairs connected with the selected memory cells, the cache memory is further provided with a write back buffer for temporarily holding data written in a part of memory cells of the cache memory cell array when the data is necessary to be written in a main storage device, the write back buffer is constituted by a specific memory cell row included in the cache memory cell array, and including at least one row of memory cells extending in the row direction, and bit line pairs connected with the memory cells of the specific memory cell row constituting the write back buffer are commonly used as the bit line pairs of the cache memory cell array.

In one aspect of the cache memory, data of the memory cells aligned in one row selected by the selected word line are read through the bit line pairs connected with the selected memory cells regardless of selection of the specific memory cell row constituting the write back buffer, and the cache memory is further provided with writing means for selecting the specific memory cell row constituting the write back buffer when the data of the memory cells aligned in one row selected by the selected word line are read, and writing all data of the selected memory cells aligned in one row in the memory cells included in the specific memory cell row constituting the write back buffer through the bit line pairs connected with the selected memory cells.

In another aspect of the cache memory, the memory cells aligned in one row and included in the specific memory cell row constituting the write back buffer are selected by a word line for selecting the specific memory cell row, and data of the selected memory cells aligned in one row and included in the specific memory cell row are read through bit line pairs connected with the selected memory cells.

Furthermore, the cache memory can further comprises a column switch for selecting a part of plural data read in the plural bit line pairs, and the part of data selected by the column switch is externally output to a data bus of a microprocessor.

In still another aspect of the cache memory, each row of the cache memory cell array and the specific memory cell row constituting the write back buffer includes memory cells in a number equal to a number of data in a minimum unit transferred to and received from the main storage device.

In still another aspect of the cache memory, each of the memory cells included in the specific memory cell row is constructed by using a static memory cell including a cross connection circuit having a pair of inverting devices each constructed by a serial circuit having an input terminal and an output terminal and including serially connected load device and driving MOSFET, the pair of inverting devices being cross connected with the input terminals and the output terminals of the serial circuits; at least a pair of transferring MOSFETs each disposed between each of the output terminals of the pair of inverting devices and a bit line pair; and a controlling MOSFET disposed between a shared source shared by the driving MOSFETs of the pair of inverting devices and a reference potential line and controlled to be set in an unselected state in a data write operation.

Alternatively, each of the memory cells included in the specific memory cell row is constructed by using a static memory cell including a cross connection circuit having a pair of inverting devices each constructed by a serial circuit having an input terminal and an output terminal and including serially connected load device and driving MOSFET, the pair of inverting devices being cross connected with the input terminals and the output terminals of the serial circuits; at least a pair of transferring MOSFETs each disposed between each of the output terminals of the pair of inverting devices and a bit line pair; and a pair of controlling MOSFETs disposed respectively between one of the driving MOSFETs of the pair of inverting devices and a reference potential line and between the other of the driving MOSFETs and the reference potential line and controlled to be set in an unselected state in a data write operation.

Owing to the aforementioned configuration, in the semiconductor storage device of the invention, all data selected by an arbitrary word line in the memory cell array can be written in the specific memory cell row through the plural bit line pairs in a batch at the same time as a read operation. The data output to the bit line pairs are externally output from the semiconductor storage device through the column switch, the sense circuit and the output buffer, but the number of bit line pairs which are simultaneously selected by one word line and to which the data are output is several times as large as the bit number of externally output data. Accordingly, the data of the memory cells in a number several times as large as the bit number of the externally output data can be simultaneously written or saved in the specific memory cell row in a batch.

Furthermore, in a write operation in the specific memory cell row of this invention, the driving MOSFETs included in the memory cells of the specific memory cell row are disconnected from the reference potential lines. Therefore, the data of the specific memory cell row are not output to the bit lines but the data in the memory cell array selected by the arbitrary word line are output. Moreover, storage nodes of the memory cells included in the specific memory cell row are supplied with the potential of the bit lines. In other words, when the specific memory cell row is controlled to be set in the write state, all the data of the memory cells aligned in one row selected by the arbitrary word line in the memory cell array can be written in the specific memory cell row through the bit line pairs.

Additionally, in the cache memory of this invention, data of the memory cells in a number several times as large as the data width of data transferred between the cache memory and a data bus in a batch can be simultaneously written and saved in the write back buffer in a batch. For example, when addresses in the cache memory are set so that one block is allocated to one word line and the number of memory cells simultaneously selected by one word line is set at the same number as the block size, all the data of one block can be simultaneously saved in the write back buffer through one data read operation.

In this manner, when this cache memory is used, the number of accesses to be made to the cache memory in saving data in the write back buffer can be largely decreased. Furthermore, also since the data bus is not used in saving the data in the write back buffer, the throughput of the entire system using the microprocessor can be improved and the power consumption can be decreased. Also, since the write back buffer is constructed by using the memory cells, the chip area can be simultaneously decreased.

In addition, in the cache memory of this invention, when the number of data output from the cache memory to the data bus is smaller than the number of data in a minimum unit (i.e., a block) transferred between the cache memory and the main storage device, the data of one block can be saved in the write back buffer in a batch through one read operation.

BRIEF DESCRIPTION OF THE DRAWINGS

A preferred form of the present invention is illustrated in the accompanying drawings in which.

DETAILED DESCRIPTION OF THE INVENTION

A preferred embodiment of the invention will now be described with reference to the accompanying drawings.

Figure 1:
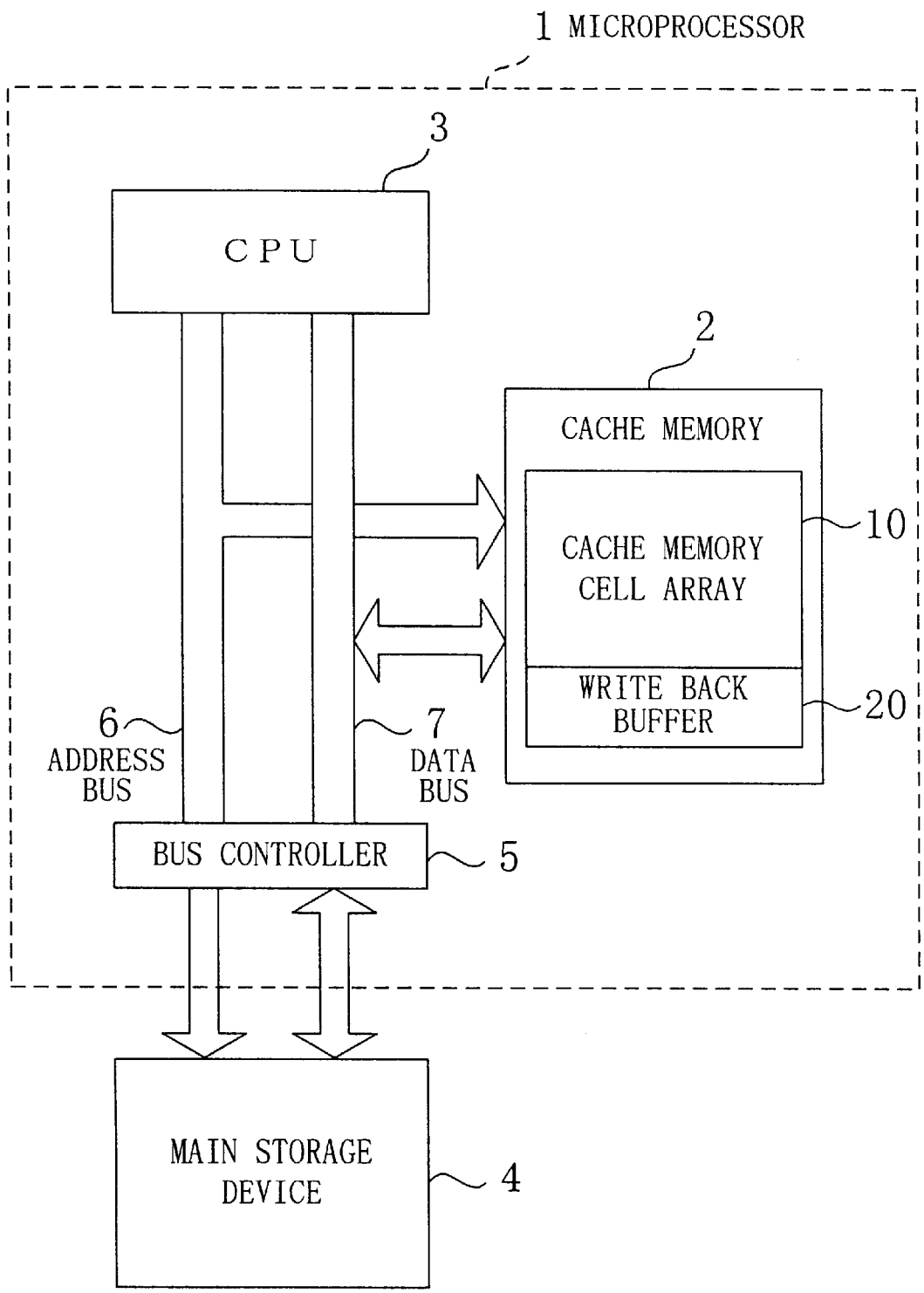
FIG. 1 is a block diagram for showing an exemplified configuration of a cache memory according to a first embodiment of the invention and peripheral related equipment.

FIG. 1 is a block diagram for showing an exemplified configuration of a cache memory according to a first embodiment of the invention and peripheral related equipment. In FIG. 1, a reference numeral 1 denotes a microprocessor, whose composing elements relating to the invention alone are shown in FIG. 1. A reference numeral 3denotes a CPU, and a reference numeral 4 denotes an external main storage device. The microprocessor 1 includes, in addition to the CPU 3, a bus controller 5, an address bus 6, a data bus 7 and a cache memory 2. The microprocessor 1 is provided with the cache memory according to this invention (namely, the cache memory 2) having a write back buffer 20 included in a cache memory cell array 10 therein.

Now, a data write operation in the cache memory 2 of this embodiment by the write back system will be described.

Similarly to the conventional cache memory, in the case where data is to be written in an arbitrary address of the cache memory 2, when data of a block including the address to be written is changed while stored in the cache memory 2, it is necessary to write back the data of the block including the address to be written in the main storage device 4 before writing new data in the cache memory 2. At this point, in the conventional cache memory, the write back buffer 9 is used for temporarily holding the data to be written back in the low-speed main storage device 4. In contrast, the cache memory cell array (memory cell array) 10 of the cache memory 2 of this embodiment includes the write back buffer 20. Therefore, in performing a write operation (save operation) in the write back buffer 20, there is no need to use the data bus 7, and the write operation, namely, the save operation, can be performed within the cache memory cell array 10 alone.

Now, a semiconductor storage device used for realizing this cache memory will be described.

Figure 2:
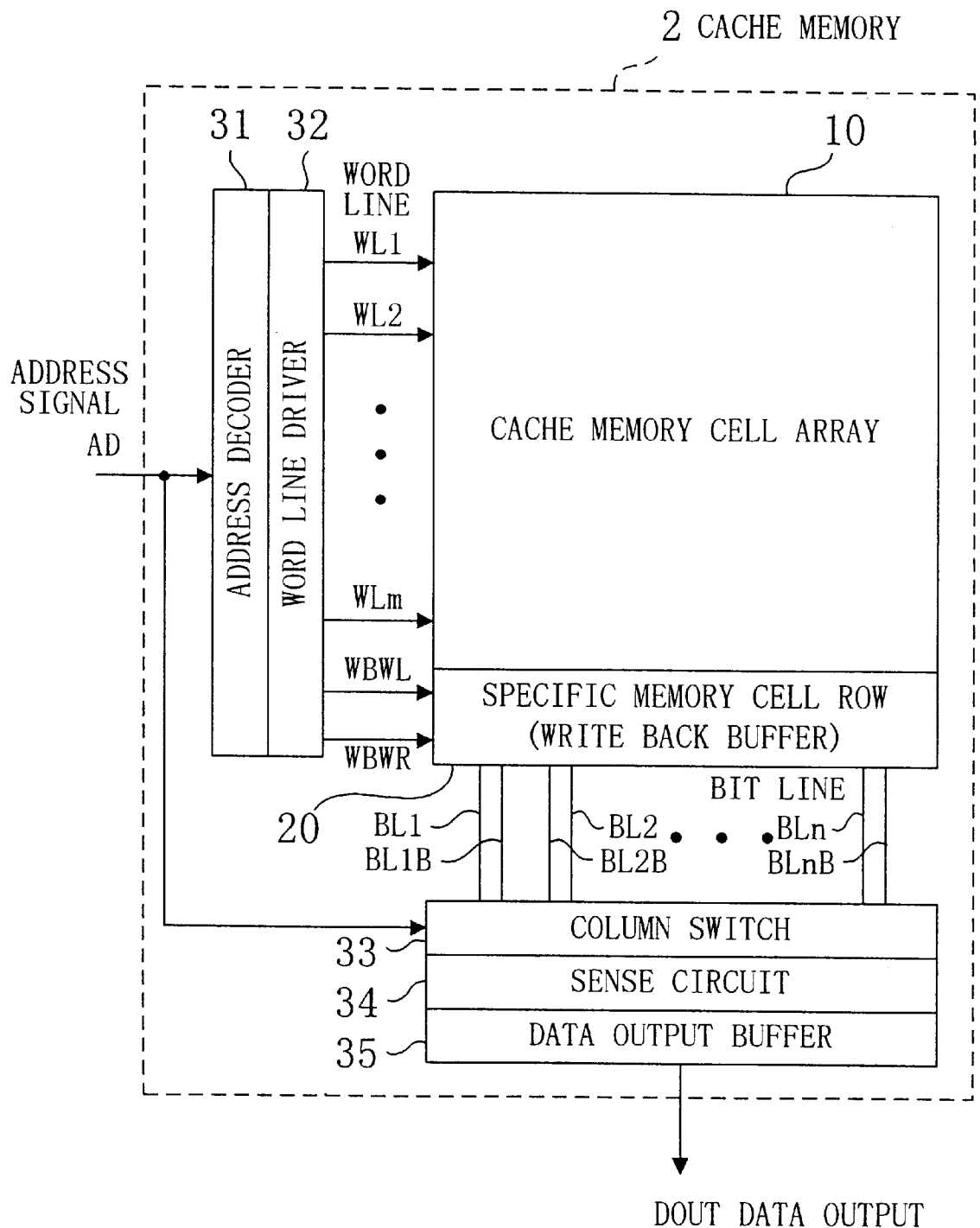
FIG. 2 is a block diagram for showing the inside configuration of the cache memory of FIG. 1.

FIG. 2 shows an exemplified configuration of the cache memory 2, which includes the memory cell array 10, an address decoder 31, a word line driver 32, a column switch 33, a sense circuit 34 and a data output buffer 35. In FIG. 2, AD indicates an address signal input from the address bus 6, and DOUT indicates data output output to the data bus 7. It is noted that merely circuits relating to the invention are shown in FIG. 2 and that a clock controller, a write circuit and the like are omitted. Also, a reference numeral 20 denotes a specific memory cell row or a write back buffer included in the memory cell array 10.

Figure 3:
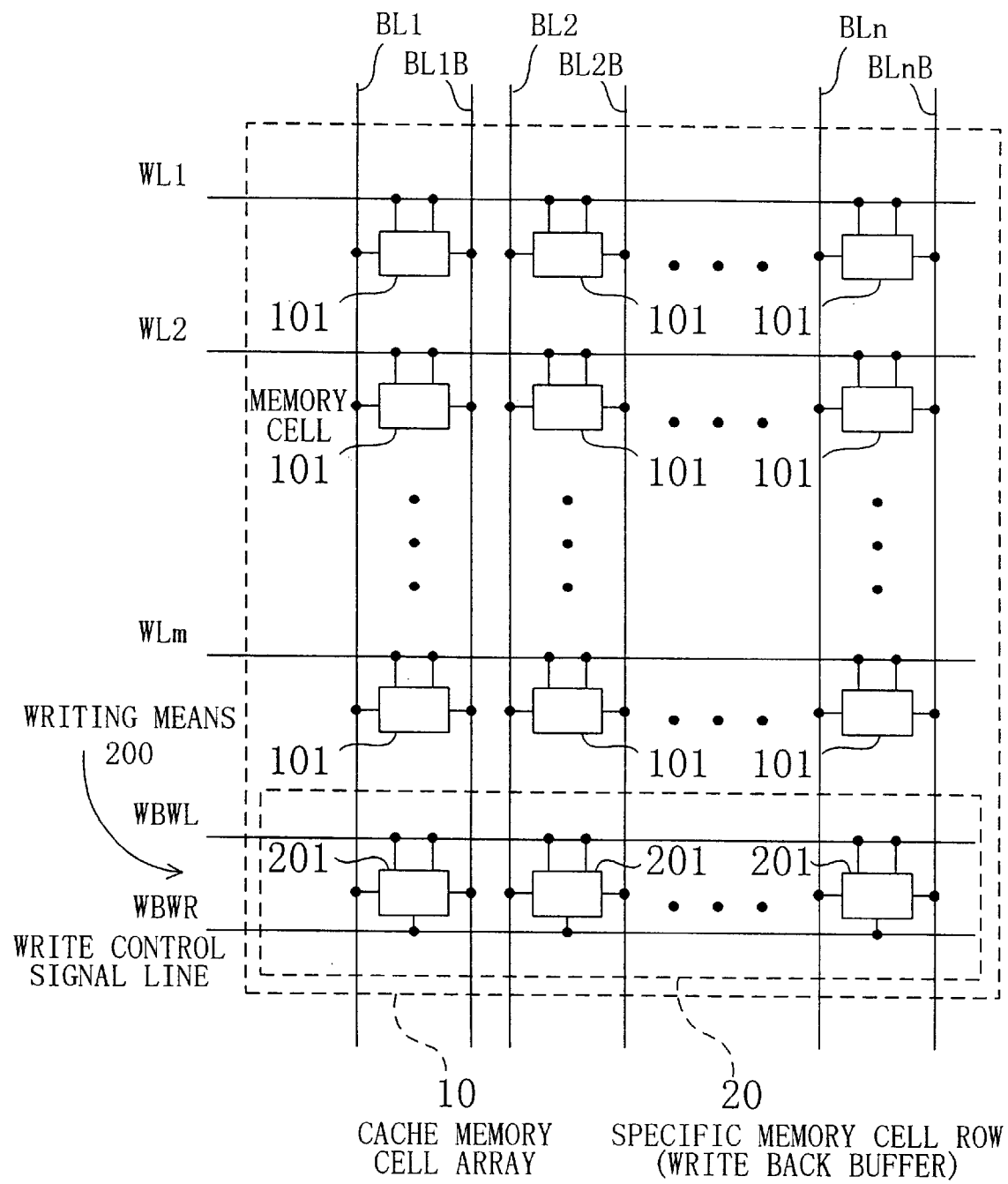
FIG. 3 is a diagram for showing an exemplified configuration of a memory cell array of the cache memory of FIG. 2.

Furthermore, FIG. 3 shows an exemplified configuration of the cache memory cell array 10, and the cache memory cell array 10 of FIG. 3 is constructed in a matrix of m rows by n columns (wherein m and n are arbitrary integers), which does not limit the invention. In FIG. 3, reference numerals 101 denote plural memory cells, reference numerals 201 denote plural memory cells included in the specific memory cell row 20, WL1 through WLm indicates word lines, BL1 through BLn and BL1B through BLnB indicate bit line pairs, WBWL indicates a word line of the specific memory cell row, and WBWR indicates a write control signal line for controlling a write operation in the specific memory cell row.

Now, the operation of this semiconductor storage device will be described.

The address signal AD is decoded by the address decoder 31, and one word line among the word lines WL1 through WLm corresponding to the address signal AD is selectively driven by the word line driver 32, thereby outputting data in the memory cells 101 corresponding to the selected word line to the bit line pairs BL1 and BL1B through BLn and BLnB. Specifically, when one word line is selected among the word lines WL1 through WLm, n memory cells 101 are simultaneously selected, and the data are output to all the bit line pairs BL1 and BL1B through BLn and BLnB. Then, the data of a part of the bit line pairs selected by the column switch 33 is amplified by the sense circuit 34 so as to be output by the data output buffer 35. When the word line WBWL of the specific memory cell row 20 is not selected, this operation is the same as a general read operation of a static RAM. As described above, the clock controller, the write circuit and the like are omitted.

During this read operation, when the word line WBWL of the specific memory cell row 20 is selected and the write control signal line WBWR to the specific memory cell row 20 is controlled to be set in the write state, the data output to the bit line pairs BL1 and BL1B through BLn and BLnB are written in the memory cells 201 included in the specific memory cell row 20. The configuration of the memory cell 201 will be described below.

Since the bit line pairs BL1 and BL1B through BLn and BLnB are supplied with the data from all the memory cells corresponding to one word line selected among the word lines WL1 through WLm, the data are written in all the memory cells 201 included in the specific memory cell row 20 at the same time.

In general, the column switch 33 selects a part of the bit line pairs, and hence, the number n of the bit line pairs is larger than the bit number of the data output DOUT. For example, in the case where the data width of the data output DOUT is 32 bits, the number n of the bit line pairs can be 64, 128, 256, etc. Actually, the number n of the bit line pairs is determined in view of the delay time of the word line and a consumed current depending upon the number of bit line pairs simultaneously selected.

When the data of all the memory cells corresponding to the selected word line are to be written in anywhere through the data output DOUT in this manner, it is necessary to make several accesses to the memory cells. However, by adopting the configuration of this embodiment, the data of all the memory cells corresponding to the selected word line can be written in the specific memory cell row 20 through the bit line pairs at the same time and in a batch through one access.

Furthermore, in reading the specific memory cell row 20, the data can be read in the same manner as in reading the general memory cells 101, with all the word lines WL1 through WLm unselected, with the word line WBWL of the specific memory cell row 20 selected, and with the write control signal line WBWR to the specific memory cell row 20 controlled to be set in the read state.

Next, exemplified configurations of the memory cells will be described with reference to FIGS. 4 through 6.

Figure 4:
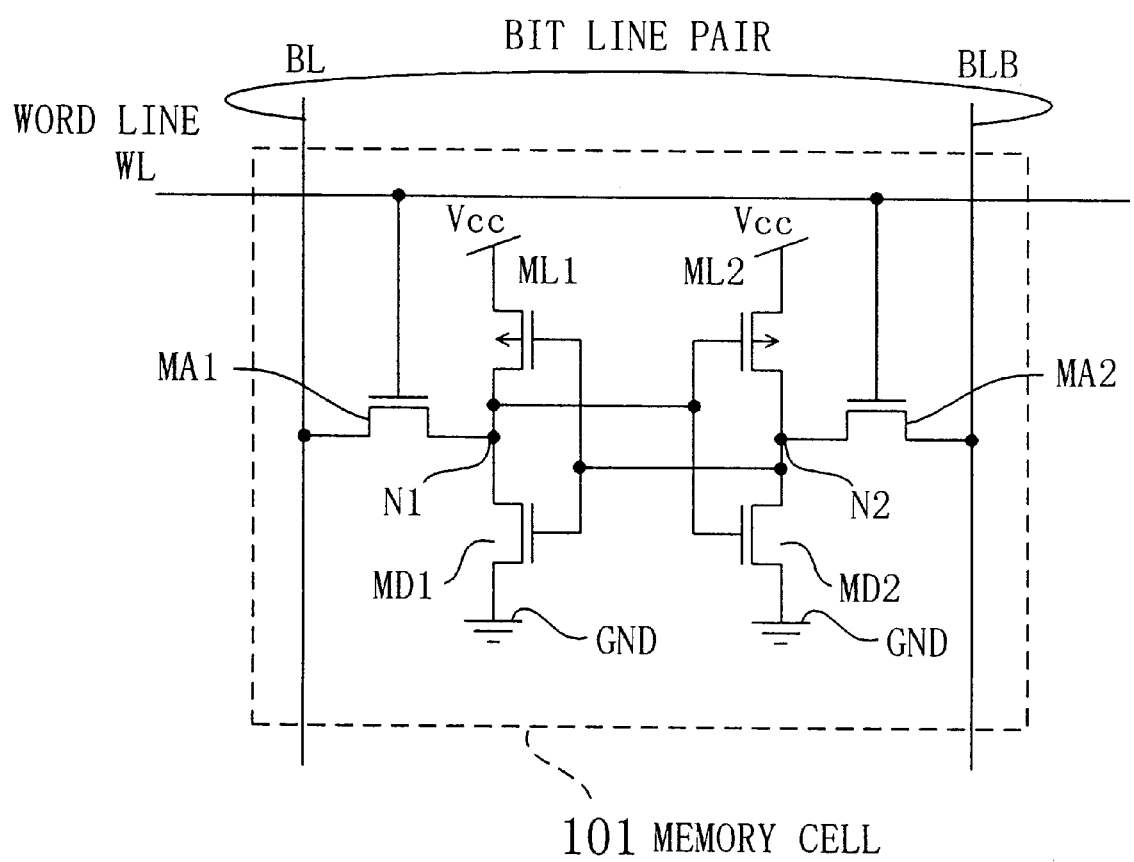
FIG. 4 is a diagram for showing an exemplified configuration of a memory cell of FIG. 3.

FIG. 4 shows an exemplified configuration of the general memory cell 101, wherein WL indicates a word line, BL and BLB indicate a bit line pair, ML1 and ML2 indicate loading MOSFETs, MD1 and MD2 indicate driving MOSFETs, and MA1 and MA2 indicate transferring MOSFETs.

Figure 5:
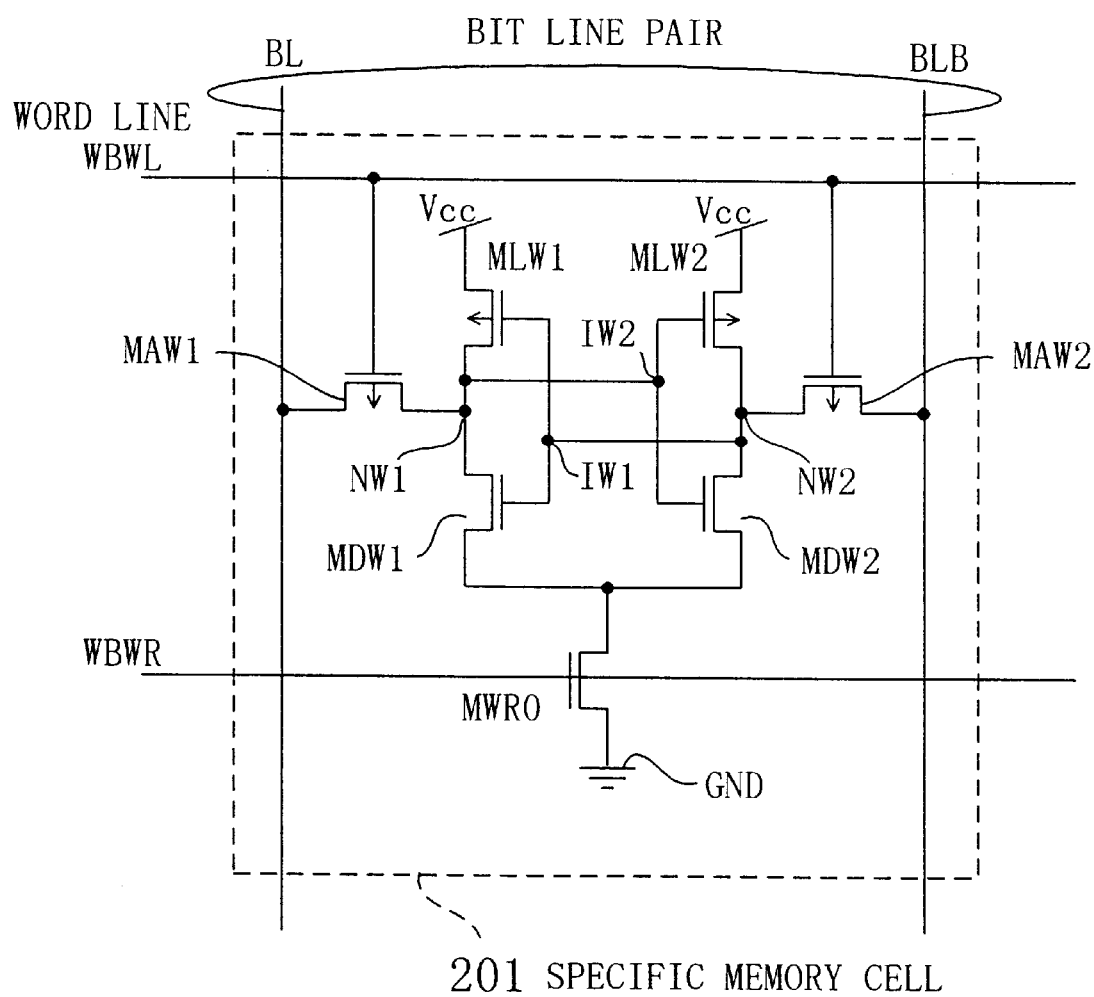
FIG. 5 is a diagram for showing an exemplified configuration of a memory cell included in a specific memory cell row of the first embodiment of the invention.

FIG. 5 shows an exemplified configuration of the memory cell 201 included in the specific memory cell row 20, and in this example, the memory cell 201 is constituted by a static memory cell. In FIG. 5, WBWL indicates a word line, and BL and BLB indicate a bit line pair. The memory cell 201 includes a pair of inverting devices, one of which includes serial connection of a loading MOSFET (load device) MLW1 and a driving MOSFET MDW1 and the other of which includes serial connection of another loading MOSFET (load device) MLW2 and another driving MOSFET MDW2. The input terminals IW1 and IW2 and the output terminals NW1 and NW2 of these inverting devices are cross connected, thereby constituting a cross connection circuit. Furthermore, between the output terminal NW1 of one inverting device and one bit line BL of the bit line pair BL and BLB, a transferring MOSFET MAW1 is interposed, and between the output terminal NW2 of the other inverting device and the other bit line BLB, a transferring MOSFET MAW2 is interposed. These transferring MOSFETs MAW1 and MAW2 are controlled by the word line WBWL. Also, MWR0 indicates a controlling MOSFET to be controlled to be unselected by the write control signal line WBWR in a write operation. This controlling MOSFET MWR0 is disposed between a shared source shared by the pair of driving MOSFETs MDW1 and MDW2 and a reference potential line GND. In this case, p-channel MOSFETs are used as the transferring MOSFETs MAW1 and MAW2 because of a bit line potential described below.

Figure 6:
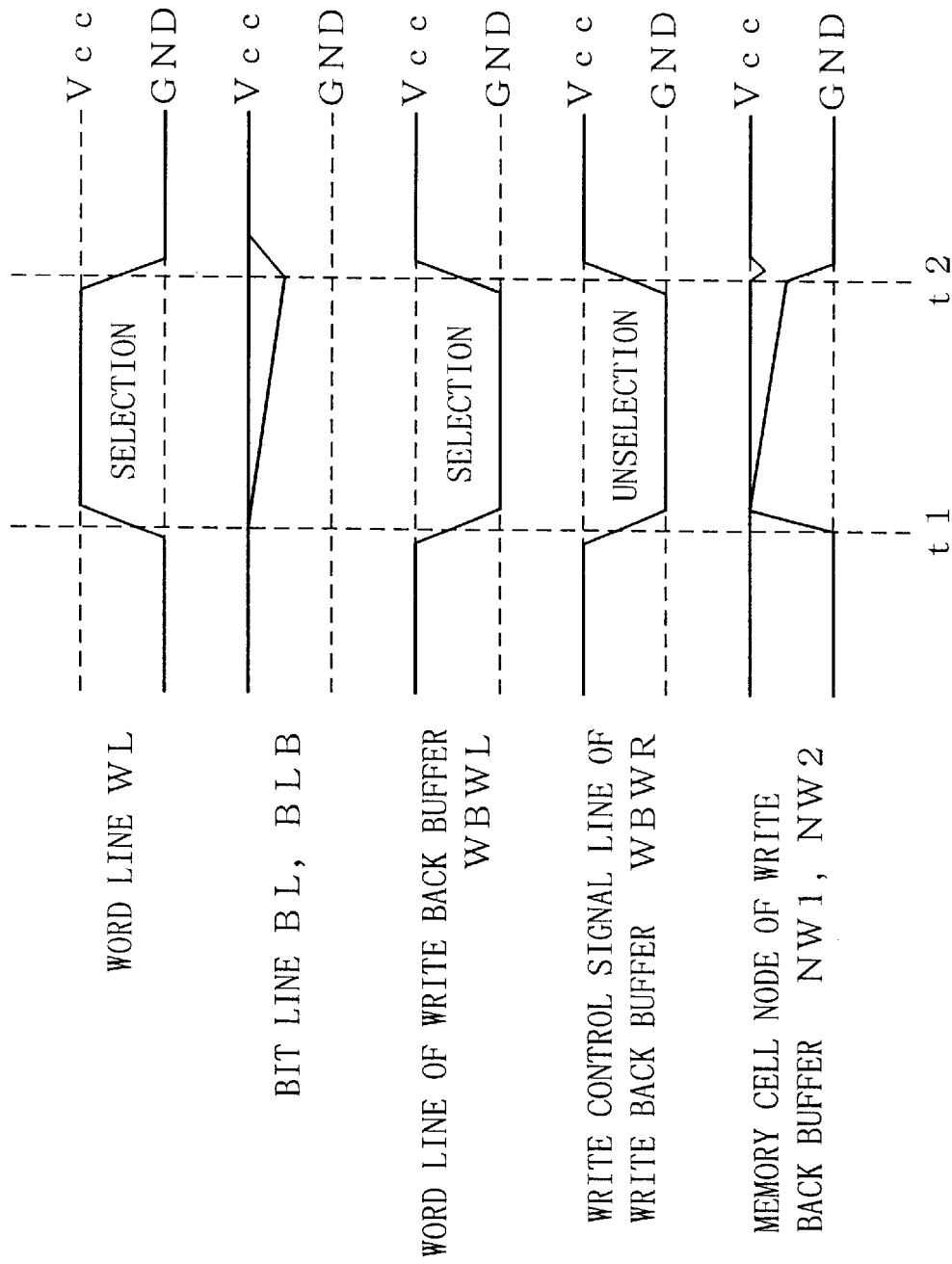
FIG. 6 is a diagram for showing a rough waveform in a data write operation in the memory cell of FIG. 5.

FIG. 6 shows a rough waveform in a write operation in the memory cell 201 of FIG. 5.

Now, this write operation will be described.

Through the activation (selection) of the word line WL of the general memory cells 101, the data of the corresponding memory cells 101 are output to the bit line pairs BL and BLB. At this point, when the word line WBWL of the memory cells 201 included in the specific memory cell row 20 is deactivated (unselected), the general read operation is conducted.

On the other hand, in writing data in the memory cells 201 included in the specific memory cell row 20, the word line WBWL of the memory cells 201 included in the specific memory cell row 20 is activated (selected) and the controlling MOSFET MWR0 is controlled to be unselected by the write control signal line WBWR. Since the controlling MOSFET MWR0 is unselected, the data storage nodes (output terminals) NW1 and NW2 of the memory cells 201 included in the specific memory cell row 20 are disconnected from the ground potential. Accordingly, the data held in the data storage nodes NW1 and NW2 are not output to the bit line pair BL and BLB, but the data output to the bit line pair BL and BLB from the general memory cell 101 are transferred to the data storage nodes NW1 and NW2. In this embodiment, the bit line pair BL and BLB are precharged to a supply voltage, and the p-channel MOSFETs are used as the transferring MOSFETs MAW1 and MAW2, and hence, a small amplitude between the bit line pair BL and BLB close to the supply voltage can be transferred to the data storage nodes NW1 and NW2.

Then, the controlling MOSFET MWR0 is controlled to be selected by using the write control signal line WBWR, and the memory cells 201 conduct the same operation as a sense circuit, so that the small amplitude close to the supply voltage between the data storage nodes NW1 and NW2 can be increased to a reference potential. Thus, the data can be accurately held (time t2). In other words, at this point, the data stored by the general memory cells 101 are written in the memory cells 201. In this case, the word line WL of the general memory cells 101 and the word line WBWL of the memory cells 201 included in the specific memory cell row 20 can be placed in the unselected state.

Furthermore, when merely the word line WBWL of the memory cells 201 included in the specific memory cell row 20 is selected with the word line WL of the general memory cells 101 set in the unselected state and with the controlling MOSFET MWR0 selected by the write control signal line WBWR, the data in the memory cells 201 included in the specific memory cell row 20 are output to the bit line pair BL and BLB. Thus, the data can be read in the same manner as in the general operation.

In this manner, writing means 200 is constructed by the configuration where the word line WBWL of the memory cells 201 included in the specific memory cell row 20 is activated (selected) and the controlling MOSFET MWR0 is controlled to be unselected by the write control signal line WBWR.

Accordingly, during the general read operation for reading data stored in the general memory cells 101 to the bit line pairs, the read data can be simultaneously written in the memory cells 201 included in the specific memory cell row 20 through the bit line pairs by operating the writing means 200.

Referring to FIG. 1 again, by using the specific memory cell row 20 of the cache memory 2 included in the semiconductor storage device described with reference to FIGS. 2 through 6 as a write back buffer, the semiconductor storage device is used as the cache memory in the microprocessor 1 of FIG. 1 as follows:

As described with reference to FIGS. 2 through 6, by using the specific memory cell row 20 as the write back buffer, the data of all the memory cells corresponding to the selected word line in the memory cell array can be simultaneously written and saved in the write back buffer 20 in a batch. The width of data which can be simultaneously written and saved is several times as large as the width of data transferred between the cache memory and the data bus 7 in a batch. Therefore, for example, in this embodiment, addresses in the cache memory 2 are set so that entire one block (namely, data in a minimum unit transferred between the cache memory and the main storage device 4) can be selected by the same one word line, and the number of memory cells aligned in one row and simultaneously selected by one word line is set at the same as the block size (the number of transferred data in a minimum unit). In this manner, all the data in one block can be output to the bit line pairs by selecting one word line, and the data of one block can be all saved in the write back buffer 20 simultaneously through one data read operation.

Accordingly, in conducting the write operation (save operation) in the write back buffer 20, the number of accesses to be made to the cache memory 2 can be largely decreased.

As described above with reference to FIGS. 1 through 6, in the semiconductor storage device of this embodiment, data of all memory cells aligned in one row in the memory cell array 10 and selected by an arbitrary word line can be written in the specific memory cell row 20 through the bit line pairs in a batch at the same time as the read operation.

Moreover, when the specific memory cell row 20 of this semiconductor storage device is used as the write back buffer and the semiconductor storage device is used as a cache memory in the system using the microprocessor 1 including the cache memory 2, the number of accesses to be made to the cache memory 2 for saving data in the write back buffer 20 can be largely decreased. In addition, also since the data bus 7 is not used in the save operation in the write back buffer 20, the throughput of the entire system using the microprocessor 1 can be improved as well as the power consumption of the microprocessor 1 can be decreased.

Additionally, since the write back buffer 20 is constructed by using the memory cells, the occupied area can be simultaneously decreased.

In the above-described embodiment, the specific memory cell row or write back buffer 20 has merely one row of memory cells, namely, merely one word line WBWL is used. However, the specific memory cell row or write back buffer 20 can include plural rows of memory cells. In this case, plural word lines WBWL are provided so as to correspond to the plural rows of the memory cells included in the specific memory cell row or write back buffer 20, and the address decoder 31 and the word line driver 32 are used for the selection of the word lines. In this manner, data in all memory cells in plural rows selected by plural word lines WL in the memory cell array 10 can be written and saved in the plural rows of the memory cells included in the specific memory cell row or write back buffer 20.

In this manner, even when a block size is larger than the number of memory cells simultaneously selected by one word line, the plural rows of the memory cells in the specific memory cell row 20 included in the memory cell array 10 can be used as the write back buffer.

Modification

Figure 7:
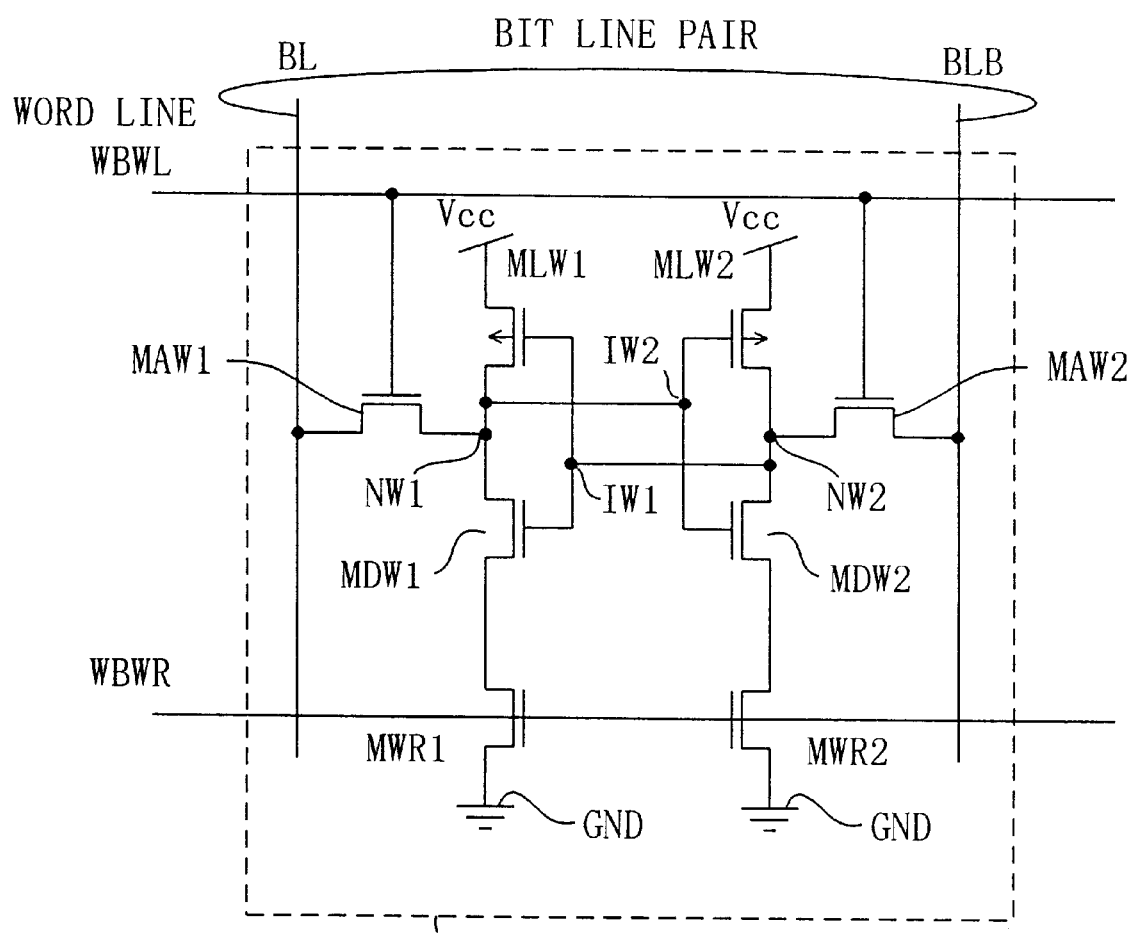
FIG. 7 is a diagram for showing modification of the configuration of the memory cell included in the specific memory cell row.
Figure 8:
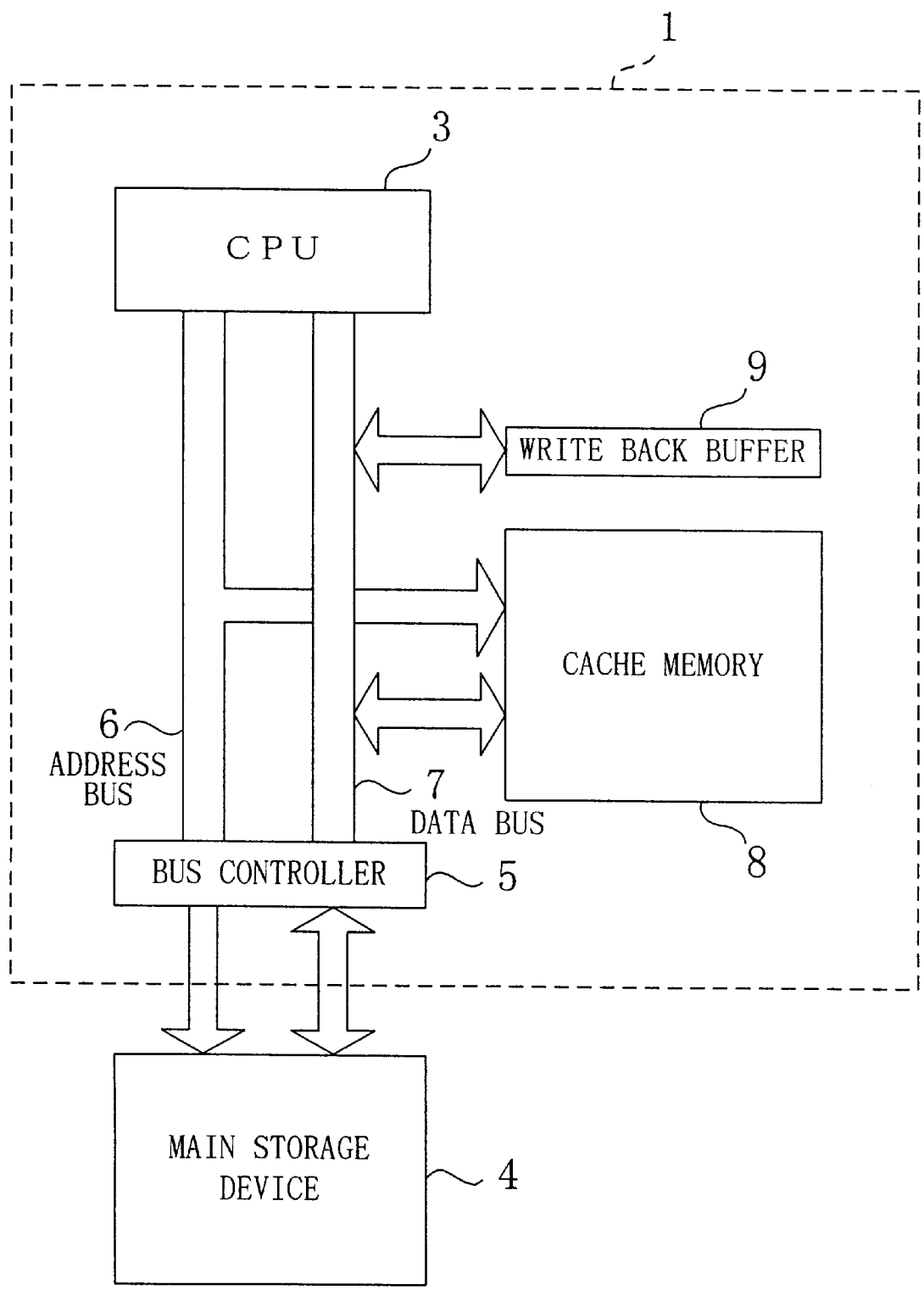
FIG. 8 is a block diagram for showing an exemplified configuration of a conventional cache memory and peripheral related equipment.

FIG. 7 shows a modification of the memory cell 201 included in the specific memory cell row 20 shown in FIG. 5.

The configuration of FIG. 7 is different from that of FIG. 5 as follows: A pair of controlling MOSFETs MWR1 and MWR2 controlled to be unselected by the write control signal line WBWR are respectively serially connected between the sources of the driving MOSFETs MDW1 and MDW2 and reference potential lines GND. The rest of the configuration is the same as that of FIG. 5. Also, the operation and the effect are completely the same.

In each of FIGS. 4, 5 and 7, a complete CMOS type memory cell is used as the memory cell, which does not limit the invention. A high resistance type memory cell or a TFT type memory cell can be used. Alternatively, a multiport type memory cell including two or more pairs of transferring MOSFETs can be used.

What is claimed is:

1. A semiconductor storage device comprising a memory cell array including memory cells aligned in an array, each of said memory cells connected with each interconnection point between plural word lines extending in a row direction and plural bit line pairs extending in a column direction, wherein one word line is selected among said plural word lines for selecting memory cells aligned in one row connected with said selected word line, and data are read from and written in said selected memory cells through bit line pairs connected with said selected memory cells, said memory cell array is provided with a specific memory cell row including at least one row of memory cells extending in the row direction, and said semiconductor storage device is further provided with writing means for writing all data of said memory cells aligned in one row and selected by said selected word line in said specific memory cell row through said bit line pairs connected with said selected memory cells;

wherein the data of said memory cell aligned in one row and selected by said selected word line are read through said bit line pairs connected with said selected memory cells regardless of an operation of Said writing means, and said writing means selects said specific memory cell row in reading the data of said selected memory cell aligned in one row, and writes all the data of said selected memory cells aligned in one row in said one row of memory cells included in said specific memory cell row through said bit line pairs connected with said selected memory cells.

2. The semiconductor storage device of claim 1, wherein said memory cells aligned in one row and included in said specific memory cell row are selected by a word line for selecting said specific memory cell row, and data of said selected memory cells included in said specific memory cell row are read through bit line pairs connected with said selected memory cells.

3. The semiconductor storage device of claim 1 or 2, further comprising a column switch for selecting part of plural data read in said plural bit line pairs, wherein said part of data selected by said column switch is externally output to a data bus of a microprocessor.

4. The semiconductor storage device of claim 1 or 2, wherein each of said memory cells included in said specific memory cell row is constructed by using a static memory cell including:

a cross connection circuit having a pair of inverting devices each constructed by a serial circuit having an input terminal and an output terminal and including serially connected load device and driving MOSFET, said pair of inverting devices being cross connected with said input terminals and said output terminals of said serial circuits;

at least one pair of transferring MOSFETs each disposed between each of said output terminals of said pair of inverting devices and a bit line pair; and a controlling MOSFET disposed between a shared source shared by said driving MOSFETs of said pair of inverting devices and a reference potential line and controlled to be set in an unselected state in a data write operation.

5. The semiconductor storage device of claim 1 or 2, wherein each of said memory cells included in said specific memory cell row is constructed by using a static memory cell including:

a cross connection circuit having a pair of inverting devices each constructed by a serial circuit having an input terminal and an output terminal and including serially connected load device and driving MOSFET, said pair of inverting devices being cross connected with said input terminals and said output terminals of said serial circuits;

at least one pair of transferring MOSFETs each disposed between each of said output terminals of said pair of inverting devices and a bit line pair; and a pair of controlling MOSFETs disposed respectively between one of said driving MOSFETs of said pair of inverting devices and a reference potential line and between the other of said driving MOSFETs and said reference potential line and controlled to be set in an unselected state in a data write operation.

6. The semiconductor storage device of claim 1, wherein said writing means writes all of the data of said memory cells aligned in one row into said memory cells of said specific memory cell row simultaneously.

7. The semiconductor storage device of claim 1, wherein there is a one-to-one correspondence between said memory cells aligned in a given row and said memory cells contained in said specific memory cell row such that each cell aligned in said given row forms a column with said corresponding cell in said specific memory cell row.

8. The semiconductor storage device of claim 7, wherein each column has a distinct pair of bit lines coupled to said cells forming said column.

9. A cache memory comprising a cache memory cell array including memory cells aligned in an array, each of said memory cells connected with each intersection point between plural word lines extending in a row direction and plural bit line pairs extending in column direction, wherein one of said plural word lines is selected for selecting memory cells aligned in one row connected with said selected word line, and data are read from and written in said selected memory cells through bit line pairs connected with said selected memory cells, said cache memory is further provided with a write back buffer for temporarily holding data written in a part of memory cells of said cache memory cell array when said data is necessary to be written in a main storage device, said write back buffer is constituted by a specific memory cell row included in said cache memory cell array, and including at least on row of memory cells extending in the row direction, and bit line pairs connected with said memory cells of said specific memory cell row constituting said write back buffer are commonly used as said bit line pairs of said cache memory cell array;

wherein data of said memory cells in one row selected by said selected word line are read through said bit line pairs connected with said selected memory cells regardless of selection of said specific memory cell row constituting said write back buffer, and said cache memory is further provided with writing means for selecting said specific memory cell row constituting said write back buffer when the data of said memory cells aligned in one row selected by said selected word line are read, and writing all data of said selected memory cells aligned in one row in said memory cells included in said specific memory cell row constituting said write back buffer through said bit line pairs connected with said selected memory cells.

10. The cache memory of claim 9, wherein said memory cells aligned in one row and included in said specific memory cell row constituting said write back buffer are selected by a word line for selecting said specific memory cell row, and data of said selected memory cells aligned in one row and included in said specific memory cell row are read through bit line pairs connected with said selected memory cells.

11. The cache memory of claim 9 or 10, further comprising a column switch for selecting a part of plural data read in said plural bit line pairs, wherein said part of data selected by said column switch is externally output to a data bus of a microprocessor.

12. The cache memory of claim 11, wherein each row of said cache memory cell array and said specific memory cell row constituting said write back buffer includes memory cells in a number equal to a number of data in a minimum unit transferred to and received from said main storage device.

13. The cache memory of claim 9 or 10, wherein each of said memory cells included in said specific memory cell row is constructed by using a static memory cell including:

a cross connection circuit having a pair of inverting devices each constructed by a serial circuit having an input terminal and an output terminal and including serially connected load device and driving MOSFET, said pair of inverting devices being cross connected with said input terminals and said output terminals of said serial circuits;

at least a pair of transferring MOSFETs each disposed between each of said output terminals of said pair of inverting devices and a bit line pair; and a controlling MOSFET disposed between a shared source shared by said driving MOSFETs of said pair of inverting devices and a reference potential line and controlled to be set in an unselected state in a data write operation.

14. The cache memory of claim 9 or 10, wherein each of said memory cells included in said specific memory cell row is constructed by using a static memory cell including:

a cross connection circuit having a pair of inverting devices each constructed by a serial circuit having an input terminal and an output terminal and including serially connected load device and driving MOSFET, said pair of inverting devices being cross connected with said input terminals and said output terminals of said serial circuits;

at least a pair of transferring MOSFETs each disposed between each of said output terminals of said pair of inverting devices and a bit line pair; and a pair of controlling MOSFETs disposed respectively between one of said driving MOSFETs of said pair of inverting devices and a reference potential line and between the other of said driving MOSFETs and said reference potential line and controlled to be set in an unselected state in a data write operation.

15. The cache memory of claim 9, wherein all of the data stored in said selected memory cells aligned in one row is written into said at least one row of memory cells of said write back buffer simultaneously.

16. The cache memory of claim 9, wherein there is a one-to-one correspondence between said memory cells aligned in a given row and said memory cells contained in said specific memory cell row such that each cell aligned in said given row forms a column with said corresponding cell in said specific memory cell row.

17. The cache memory of claim 16, wherein each column has a distinct pair of bit lines coupled to said cells forming said column.

* * * * *